US007130197B2

(12) United States Patent
Chin

(10) Patent No.: US 7,130,197 B2
(45) Date of Patent: Oct. 31, 2006

(54) HEAT SPREADER

(75) Inventor: Kwong Kei Chin, Fremont, CA (US)

(73) Assignee: Artesyn Technologies, Inc., Boca Raton, FL (US)

( * ) Notice: Subject to any disclaimer, the term of this patent is extended or adjusted under 35 U.S.C. 154(b) by 177 days.

(21) Appl. No.: 10/936,843

(22) Filed: Sep. 9, 2004

(65) Prior Publication Data

US 2006/0050485 A1 Mar. 9, 2006

(51) Int. Cl.
*H05K 7/20* (2006.01)

(52) U.S. Cl. ........................ 361/719; 361/704; 336/55; 336/90; 165/80.3

(58) Field of Classification Search ..................... None
See application file for complete search history.

(56) References Cited

U.S. PATENT DOCUMENTS 4,000,483 A * 12/1976 Cook et al. ................... 336/98
4,085,395 A * 4/1978 Billerbeck et al. ............ 336/61
5,210,513 A 5/1993 Khan et al.
6,434,005 B1 * 8/2002 Vinciarelli et al. ......... 361/704
6,603,381 B1 * 8/2003 Attarian et al. ............. 336/175
6,844,802 B1 * 1/2005 Drummond et al. .......... 336/61

* cited by examiner

*Primary Examiner*—Boris Chervinsky
(74) *Attorney, Agent, or Firm*—Kirkpatrick & Lockhart Nicholson Graham LLP

(57) ABSTRACT

A heat spreader is disclosed. The heat spreader includes a body member, a first fin connected to the body member, a second fin connected to the body member, a third fin connected to the body member, and a fourth fin connected to the body member. The first and second fins define a first spacing therebetween. The second and third fins define a second spacing therebetween. The third and fourth fins define a third spacing therebetween. The second spacing is greater than the first spacing and the third spacing.

25 Claims, 7 Drawing Sheets

HEAT SPREADER

BACKGROUND

This application is related, generally and in various embodiments, to a heat spreader. To meet the requirements for higher and higher device densities, the physical size of many transformers continues to be reduced. As the physical size of a transformer is reduced, the ability to effectively dissipate heat from the transformer becomes increasingly difficult.

In general, depending on the design of the transformer, the coil typically dissipates approximately 30% to 70% of the heat generated by the transformer and the magnetic core dissipates the remainder through a heat sink. Thus, a significant portion of the generated heat is typically sunk through the magnetic core to the heat sink. To date, the design of heat sinks used to dissipate heat from transformers has tended to focus on maximizing the area of contact between the heat sink and the magnetic core, with little or no regard given to maximizing the area of contact between the heat sink and the coil, if any. Because the thermal conductivity of common heat sink material can be approximately fifty times greater than the thermal conductivity of common magnetic core material, the heat sinking capacity of known heat sinks is not adequate for many new transformer applications.

SUMMARY

In one general respect, this application discloses embodiments of a heat spreader. According to various embodiments, the heat spreader includes a body member, a first fin connected to the body member, a second fin connected to the body member, a third fin connected to the body member, and a fourth fin connected to the body member. The first and second fins define a first spacing therebetween. The second and third fins define a second spacing therebetween. The third and fourth fins define a third spacing therebetween. The second spacing is greater than the first spacing and the third spacing.

In another general respect, this application discloses embodiments of a transformer assembly. According to various embodiments, the transformer assembly includes a coil, a magnetic core, and a heat spreader in contact with the coil and the magnetic core. The heat spreader includes a body member, a first fin connected to the body member, a second fin connected to the body member, a third fin connected to the body member, and a fourth fin connected to the body member. The first fin is in contact with the magnetic core. The second fin is adjacent the first fin and in contact with the coil and the magnetic core. The third fin is adjacent the second fin and in contact with the coil and the magnetic core. The fourth fin is adjacent the third fin and in contact with the magnetic core.

DESCRIPTION

Figure 1:
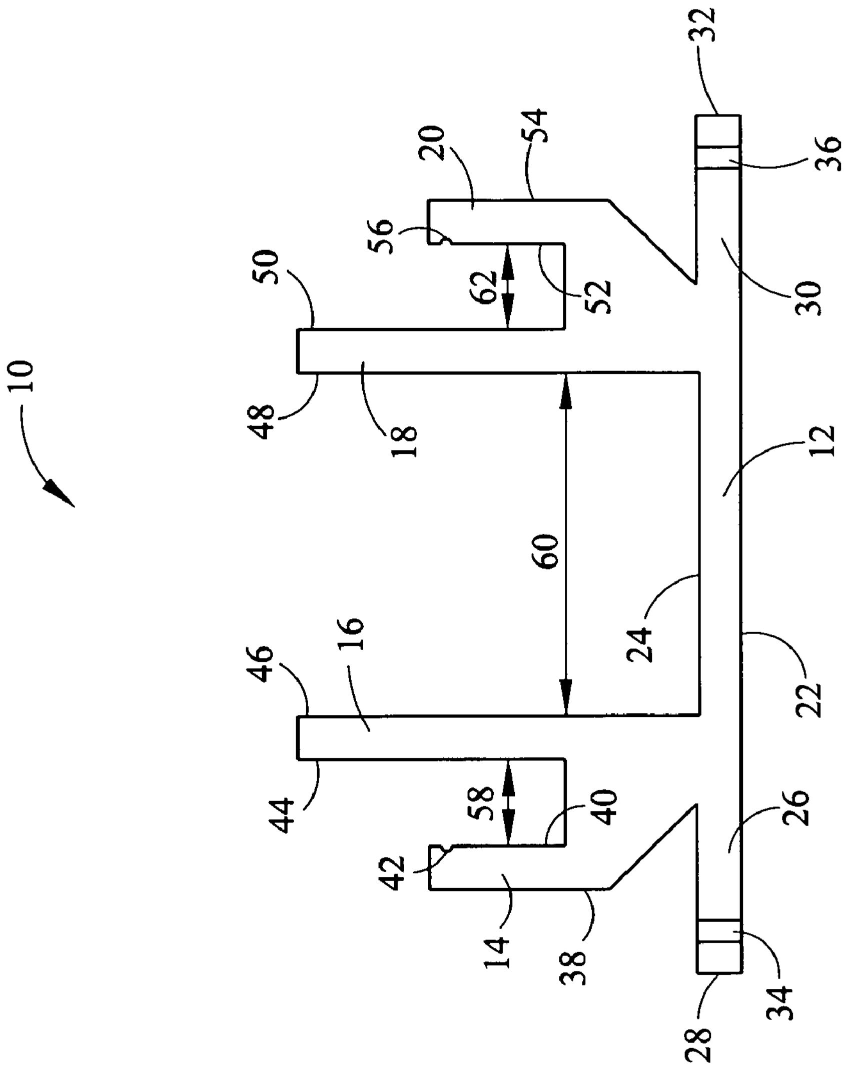
FIG. 1 illustrates various embodiments of a heat spreader.
Figure 2:
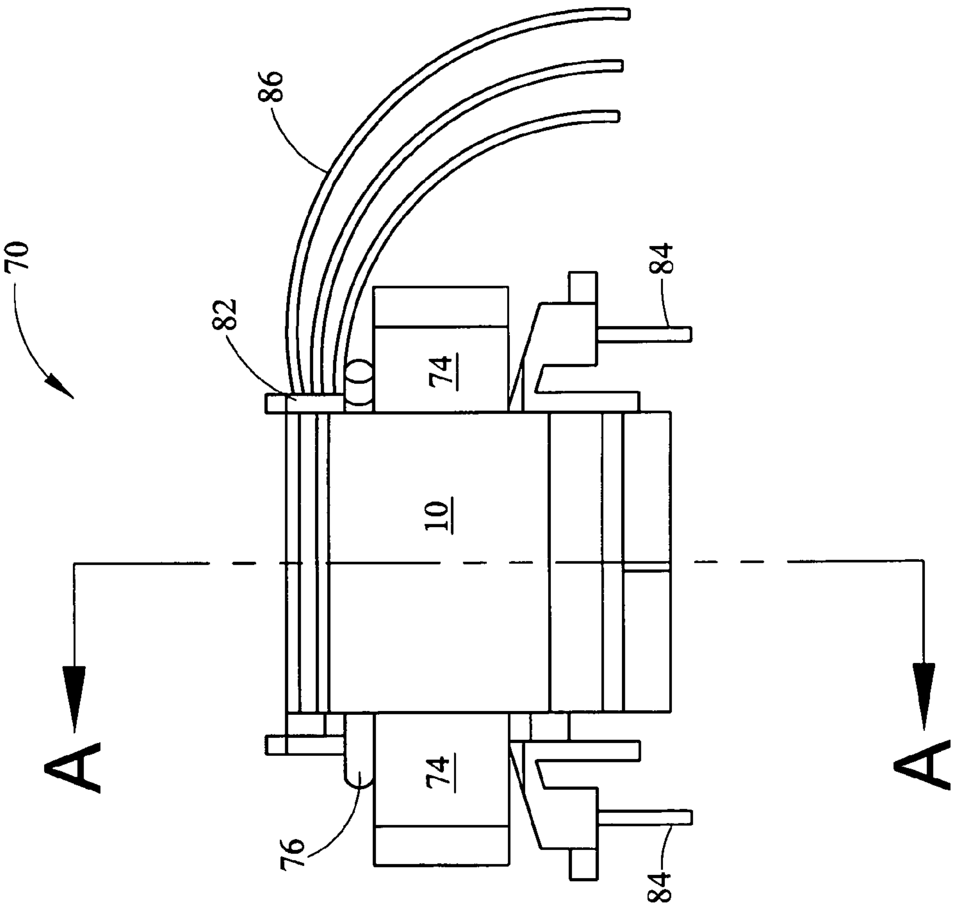
FIG. 2 illustrates various embodiments of a transformer assembly.
Figure 3:
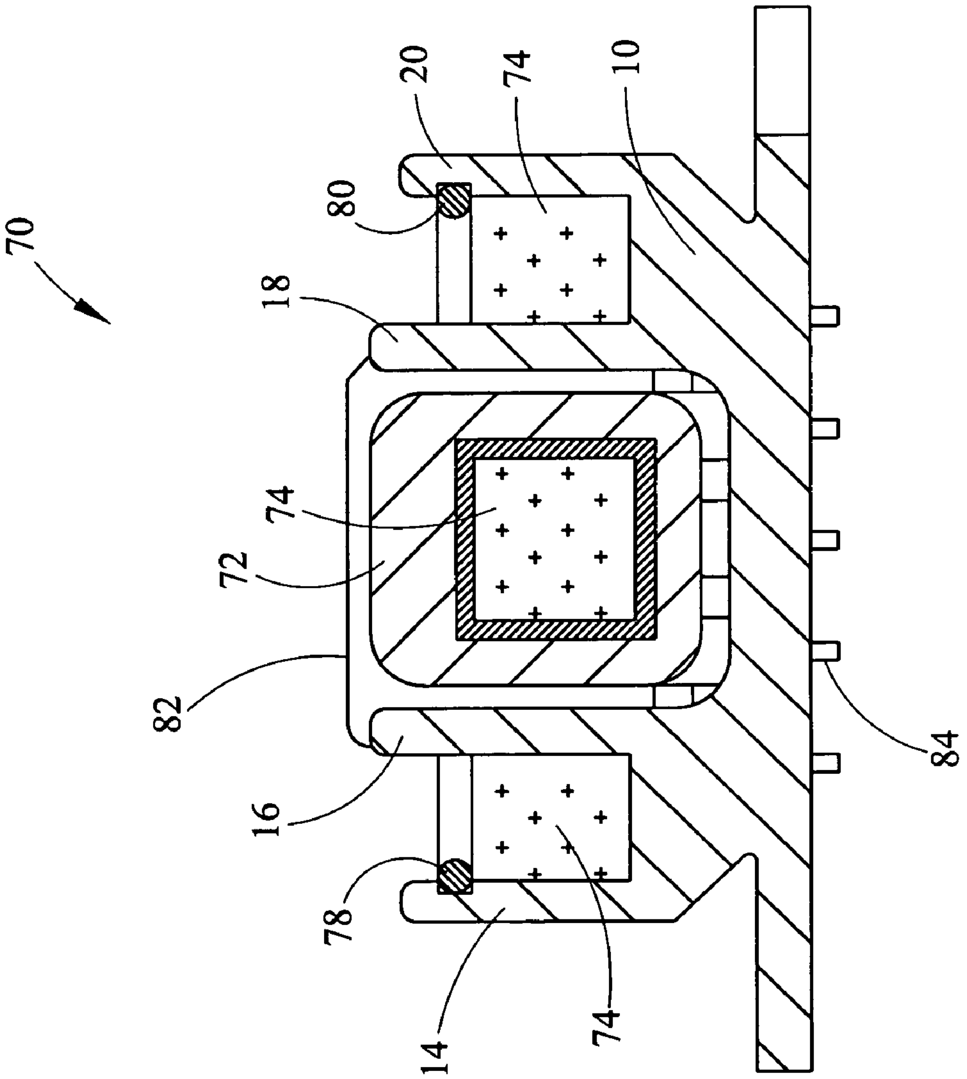
FIG. 3 illustrates a cross-section of the transformer assembly of FIG. 2 along the line A—A.
Figure 4:
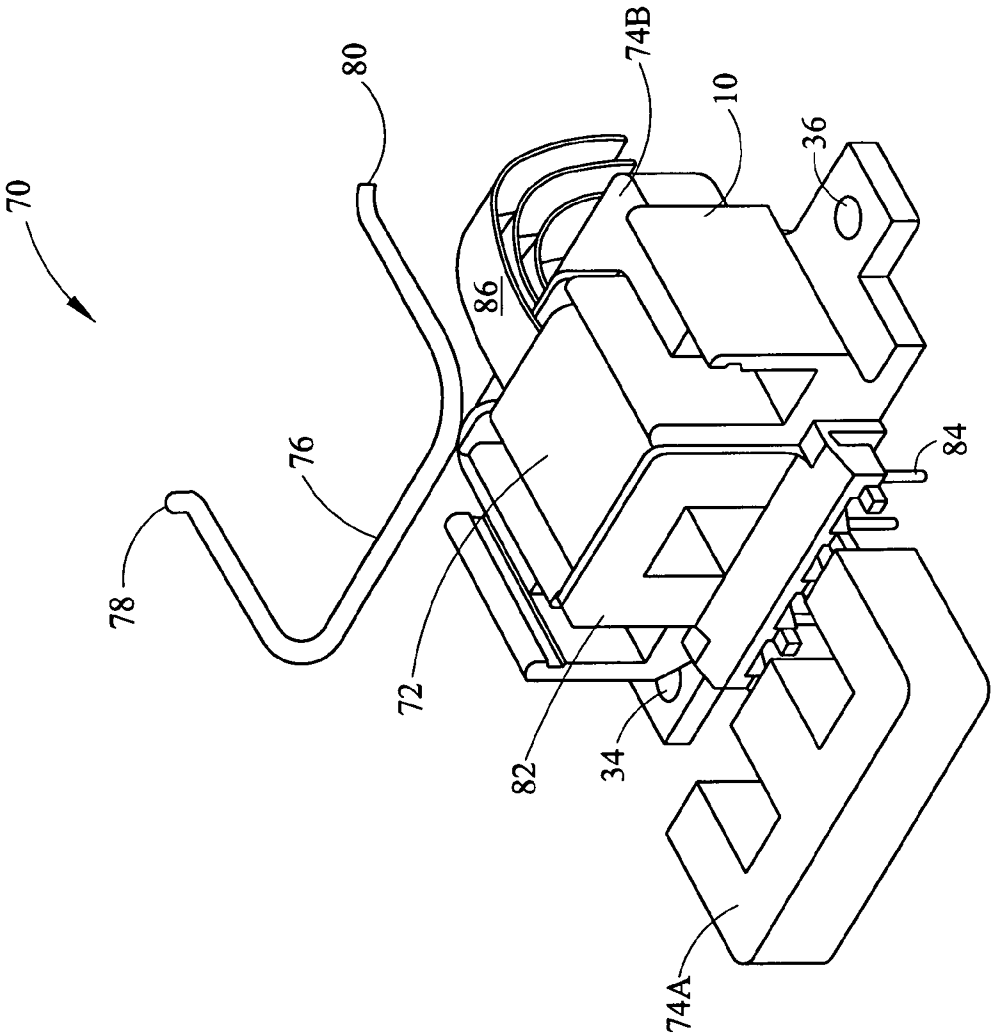
FIG. 4 illustrates a partially exploded view of the transformer assembly of FIG. 2.
Figure 5:
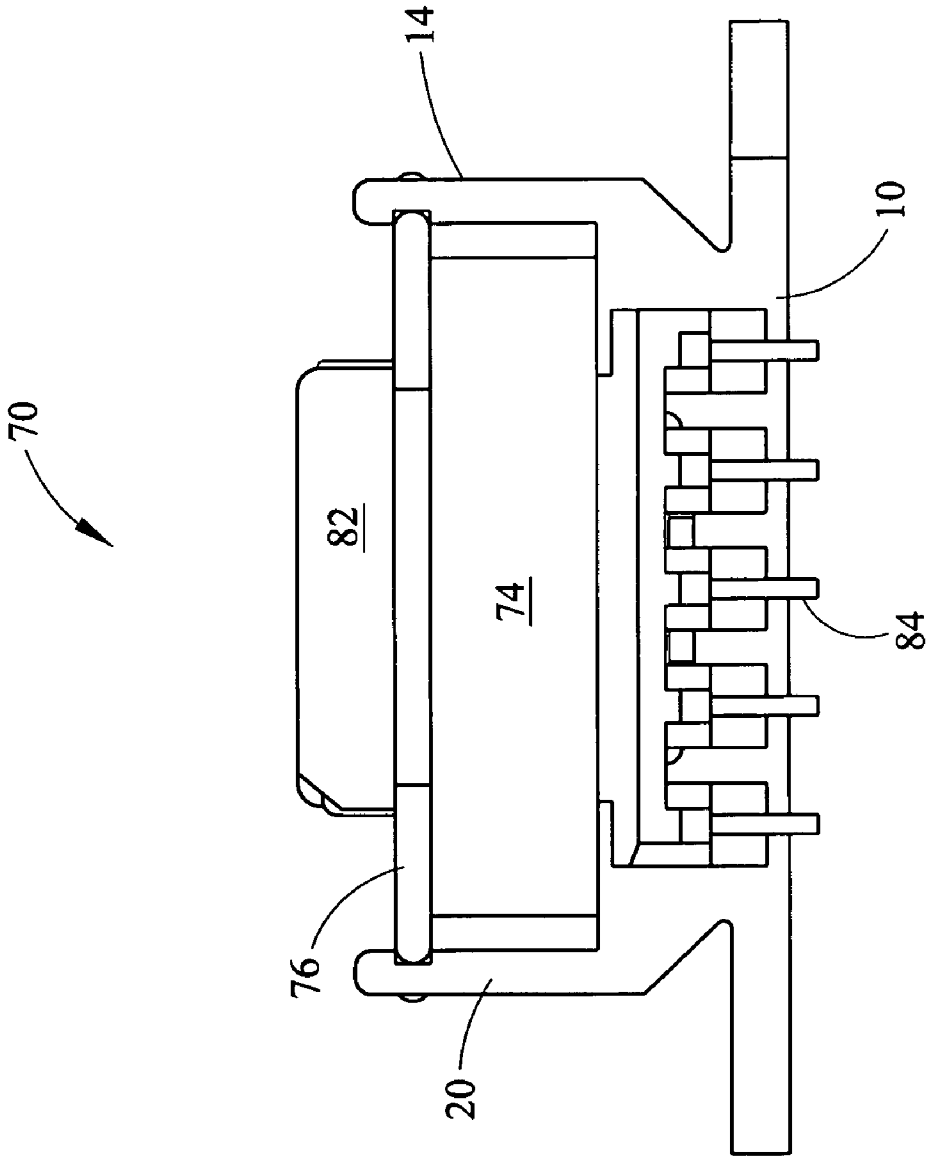
FIG. 5 illustrates a lateral view of the transformer assembly of FIG. 2.
Figure 6:
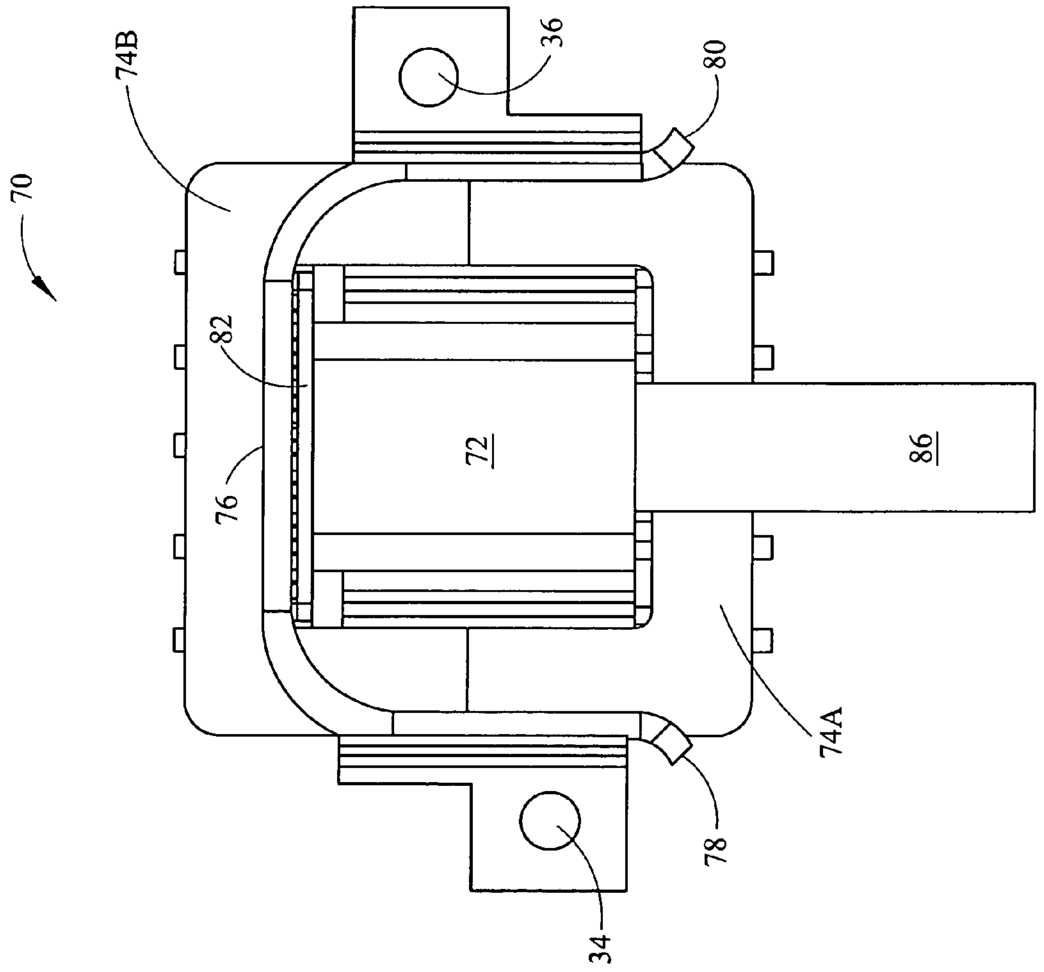
FIG. 6 illustrates a top view of the transformer assembly of FIG. 2.

FIG. 1 illustrates various embodiments of a heat spreader 10. The heat spreader 10 includes a body member 12, a first fin 14, a second fin 16, a third fin 18 and a fourth fin 20. The heat spreader 10 may be fabricated from any suitable conductive material such as, for example, a metal, and may be used to dissipate heat from a coil and a magnetic core of a transformer assembly such as, for example, the one shown in FIG. 2.

The body member 12 includes a first surface 22 and a second surface 24 opposite the first surface 22. The first surface 22 may be substantially planar. The body member 12 defines a first mounting tab 26 at a first end 28 of the body member 12 and a second mounting tab 30 at a second end 32 of the body member 12 opposite the first end 28 of the body member 12. The first mounting tab 26 may define a first mounting hole 34 and the second mounting tab 30 may define a second mounting hole 36. The first and second mounting holes 34, 36 may be used to facilitate mounting the first surface 22 of the body member 12 to an apparatus such as, for example, a heat sink. Although only two mounting holes 34, 36 are shown in FIG. 1, it is understood by those skilled in the art that each of the first and second mounting tabs 26, 30 may define more than one mounting hole. For example, according to various embodiments, the first and second mounting tabs 26, 30 may each define two mounting holes.

The first fin 14 is connected to the second surface 24 of the body member 12 proximate the first end 28 of the body member 12. The first fin 14 includes a first face 38 proximate the first end 28 of the body member 12 and a second face 40 opposite the first face 38. The first and second faces 38, 40 of the first fin 14 are substantially perpendicular to the first surface 22 of the body member 12. The first face 38 of the first fin 14 has a first cross-sectional area and the second face 40 of the first fin 14 has a second cross-sectional area. The cross-sectional area of the first face 38 of the first fin 14 may be larger than the cross-section area of the second face 40 of the first fin 14. The second face 40 of the first fin 14 defines a first groove 42.

The second fin 16 is connected to the second surface 24 of the body member 12 and is adjacent the first fin 14. The second fin 16 includes a first face 44 and a second face 46 opposite the first face 44. The first face 44 of the second fin 16 is adjacent the second face 40 of the first fin 14. The first and second faces 44, 46 of the second fin 16 are substantially perpendicular to the first surface 22 of the body member 12. The first and second faces 44, 46 of the second fin 16 are substantially parallel to the first and second faces 38, 40 of the first fin 14. The first face 44 of the second fin 16 has a first cross-sectional area and the second face 46 of the second fin 16 has a second cross-sectional area. The cross-sectional area of the second face 46 of the second fin 16 may be larger than the cross-section area of the first face 44 of the second fin 16. The cross-sectional area of the first face 44 of the second fin 16 has a cross-sectional area that is larger than the cross-section area of the second face 40 of the first fin 14.

The third fin 18 is connected to the second surface 24 of the body member 12 and is adjacent the second fin 16. The third fin 16 includes a first face 48 and a second face 50 opposite the first face 48. The first face 48 of the third fin 18 is adjacent the second face 46 of the second fin 16. The first and second faces 48, 50 of the third fin 18 are substantially perpendicular to the first surface 22 of the body member 12. The first and second faces 48, 50 of the third fin 18 are substantially parallel to the first and second faces 38, 40 of the first fin 14 and to the first and second faces 44, 46 of the second fin 16. The first face 48 of the third fin 18 has a first cross-sectional area and the second face 50 of the third fin 18 has a second cross-sectional area. The cross-sectional area of the first face 48 of the third fin 18 may be larger than the cross-section area of the second face 50 of the third fin 18.

The fourth fin 20 is connected to the second surface 24 of the body member 12 proximate the second end 32 of the body member 12 and is adjacent the third fin 18. The fourth fin 20 includes a first face 52 and a second face 54 opposite the first face 52. The first face 52 of the fourth fin 20 is adjacent the second face 50 of the third fin 18. The first and second faces 52, 54 of the fourth fin 20 are substantially perpendicular to the first surface 22 of the body member 12. The first and second faces 52, 54 of the fourth fin 20 are substantially parallel to the first and second faces 38, 40 of the first fin 14, the first and second faces 44, 46 of the second fin 16, and the first and second faces 48, 50 of the third fin 18. The first face 52 of the fourth fin 20 defines a second groove 56. The first face 52 of the fourth fin 20 has a first cross-sectional area and the second face 54 of the fourth fin 20 has a second cross-sectional area. The cross-sectional area of the second face 54 of the fourth fin 16 may be larger than the cross-section area of the first face 52 of the fourth fin 18. The cross-sectional area of the first face 52 of the fourth fin 20 has a cross-sectional area that is less than the cross-section area of the second face 50 of the third fin 18.

The first and second fins 14, 16 define a first spacing 58 therebetween, the second and third fins 16, 18 define a second spacing 60 therebetween, and the third and fourth fins 18, 20 define a third spacing 62 therebetween. For a given transformer assembly such as, for example, the one shown in FIG. 2, the first spacing 58 is sized to receive a first portion of the magnetic core of the transformer assembly therebetween, the second spacing 60 is sized to receive the coil of the transformer assembly therebetween, and the third spacing 62 is sized to receive a second portion of the magnetic core of the transformer assembly therebetween. The first spacing 58 may be substantially equivalent to the third spacing 62 and the second spacing 60 may be greater than the first and third spacings 58, 62.

According to various embodiments, the heat spreader 10 may be fabricated from a solid block of conductive material. Thus, the first, second, third and fourth fins 14, 16, 18, 20 may be integrally formed with the body member 12.

FIGS. 2–6 illustrate various embodiments of a transformer assembly 70. The transformer assembly 70 includes the heat spreader 10, a coil 72 (shown in FIG. 3), and a magnetic core 74. According to various embodiments, the magnetic core 74 may include a first E-shaped magnetic core 74A (shown in FIG. 4) and a second E-shaped magnetic core 74B (shown in FIG. 4). The first and second E-shaped magnetic cores 74A, 74B are each in contact with the second face 40 of the first fin 14, the first face 44 of the second fin 16, the second face 50 of the third fin 18, and the first face 52 of the fourth fin. 20 of the heat spreader 10. The coil 72 is in contact with the second face 46 of the second fin 16 and the first face 48 of the third fin 18. Thus, the heat spreader 10 may provide for effective dissipation of heat generated by both the coil 72 and the magnetic core 74 of the transformer assembly 70.

The transformer assembly 70 may also include a retention device 76 that helps to maintain contact between the magnetic core 74 and the heat spreader 10. The retention device 46 may be seated in the first groove 42 of the first fin 14 and the second groove 56 of the fourth fin 20. According to various embodiments, the retention device 76 may be implemented as a generally unshaped spring wire having a first end 78 (shown in FIG. 3) and a second end 80 (shown in FIG. 3). The retention device 76 may be in contact with the first groove 42 proximate the first end 78 of the retention device 76 and in contact with the second groove 56 proximate the second end 80 of the retention device 76.

The transformer assembly 70 may also include a coil bobbin 82. The coil bobbin 82 may be in contact with the second and third fins 16, 18 of the heat spreader 10. According to various embodiments, the transformer assembly 70 may be impregnated with, for example, a varnish to further improve the heat transfer from the coil 72 and the magnetic core 74 to the heat spreader 10. The transformer assembly 70 may also include a plurality of terminal pins 84 and a plurality of secondary foil leads 86.

Figure 7:
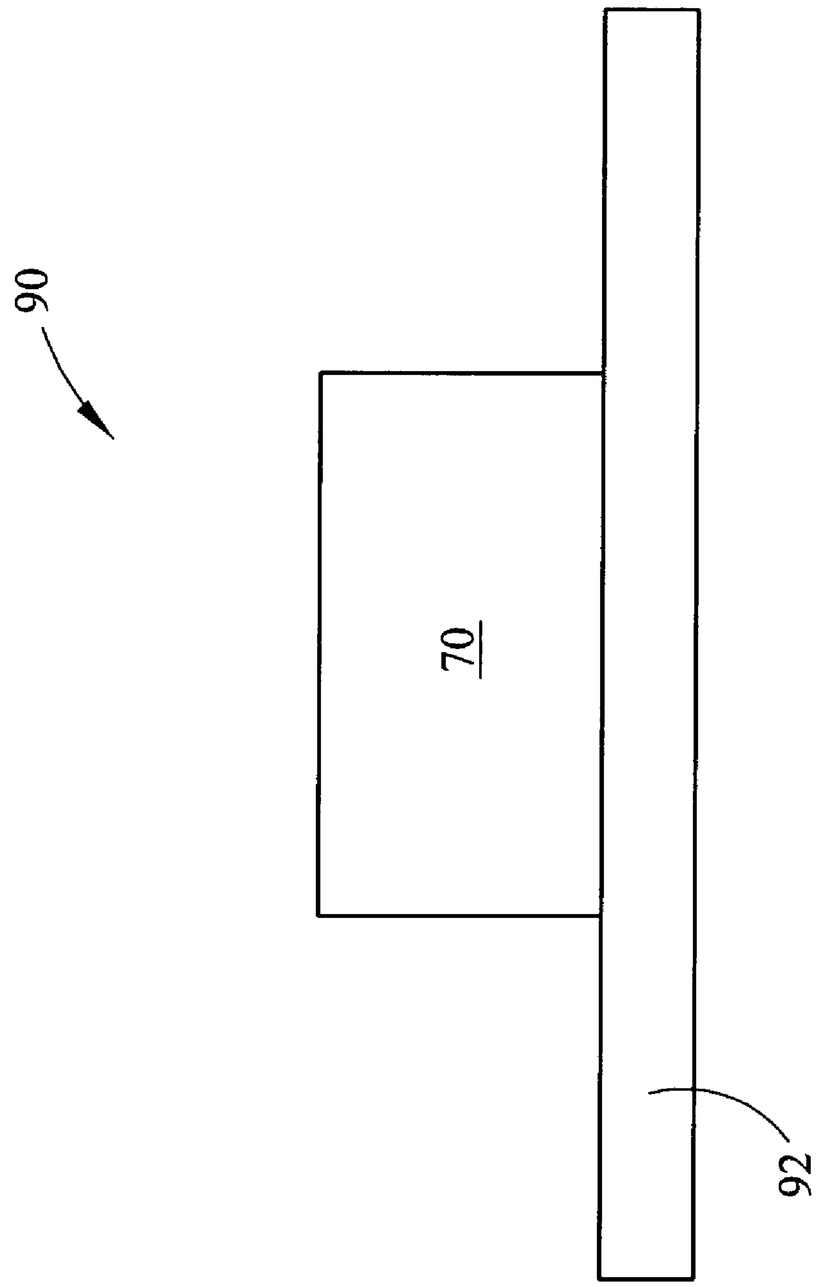
FIG. 7 illustrates various embodiments of an electrical device.

FIG. 7 illustrates various embodiments of an electrical device 90. The electrical device 90 includes the transformer assembly 70 and a printed circuit board 92 connected to the transformer assembly 70. According to various embodiments, the transformer assembly 70 may be soldered to the printed circuit board. According to various embodiments, the electrical device 90 is a power supply.

While several embodiments of the invention have been described, it should be apparent, however, that various modifications, alterations and adaptations to those embodiments may occur to persons skilled in the art with the attainment of some or all of the advantages of the present invention. It is therefore intended to cover all such modifications, alterations and adaptations without departing from the scope and spirit of the present invention as defined by the appended claims.

What is claimed is:

1. A transformer assembly, comprising:

a coil;

a magnetic core; and a heat spreader in contact with the coil and the magnetic core, wherein the heat spreader comprises:

a body member;

a first fin connected to the body member and in contact with the magnetic core;

a second fin connected to the body member and in contact with the coil and the magnetic core, wherein the second fin is adjacent the first fin;

a third fin connected to the body member and in contact with the coil and the magnetic core, wherein the third fin is adjacent the second fin; and a fourth fin connected to the body member and in contact with the magnetic core, wherein the fourth fin is adjacent the third fin.

2. The transformer assembly of claim 1, wherein the transformer assembly is impregnated with varnish.

3. The transformer assembly of claim 1, wherein the magnetic core comprises first and second E-shaped magnetic cores.

4. The transformer assembly of claim 1, further comprising a retention device having a first end and a second end, wherein the retention device is in contact with:

the first fin of the heat spreader proximate the first end of the retention device; and the fourth fin of the heat spreader proximate the second end of the retention device.

5. The transformer assembly of claim 1, wherein the heat spreader is fabricated from a metal.

6. The transformer assembly of claim 1, wherein the first, second, third and fourth fins are integrally formed with the body member.

7. The transformer assembly of claim 1, wherein the body member includes a first mounting tab and a second mounting tab.

8. The transformer assembly of claim 7, wherein the first mounting tab defines a first mounting hole and the second mounting tab defines a second mounting hole.

9. The transformer assembly of claim 1, wherein:
the body member includes a first surface and a second surface opposite the first surface;
the first fin is connected to the first surface of the body member proximate a first end of the body member;
the second fin is connected to the first surface of the body member adjacent the first fin;
the third fin is connected to the first surface of the body member adjacent the second fin; and
the fourth fin is connected to the first surface of the body member adjacent the third fin and proximate a second end of the body member.

10. The transformer assembly of claim 9, wherein:
the first fin includes:
a first face proximate the first end of the body member; and
a second face opposite the first face;
the second fin includes:
a first face adjacent the second face of the first fin; and
a second face opposite the first face of the second fin;
the third fin includes:
a first face adjacent the second face of the second fin; and
a second face opposite the first face of the third fin; and
the fourth fin includes:
a first face adjacent the second face of the third fin; and
a second surface opposite the first face of the fourth fin.

11. The transformer assembly of claim 10, wherein:
the first and second faces of the first fin are substantially perpendicular to the second surface of the body member;
the first and second faces of the second fin are substantially perpendicular to the second surface of the body member;
the first and second faces of the third fin are substantially perpendicular to the second surface of the body member; and
the first and second faces of the fourth fin are substantially perpendicular to the second surface of the body member.

12. The transformer assembly of claim 11, wherein the first and second faces of the first fin are substantially parallel to:
the first and second faces of the second fin;
the first and second faces of the third fin; and
the first and second faces of the fourth fin.

13. The transformer assembly of claim 10, wherein:
the second face of the first fin has a first cross-sectional area;
the first face of the second fin has a second cross-sectional area; and
the second face of the second fin has a third cross-sectional area, wherein the third cross-sectional area is greater than the second cross-sectional area.

14. The transformer assembly of claim 13, wherein the second cross-sectional area is greater than the first cross-sectional area.

15. The transformer assembly of claim 14, wherein:
the first face of the third fin has a fourth cross-sectional area;
the second face of the third fin has a fifth cross-sectional area;
the first face of the fourth fin has a sixth cross-sectional area, wherein the fifth cross-sectional area is greater than the sixth cross-sectional area.

16. The transformer assembly of claim 15, wherein the fourth cross-sectional area is greater than the fifth cross-sectional area.

17. The transformer assembly of claim 16, wherein:
the first cross-sectional area is substantially equivalent to the sixth cross-sectional area;
the second cross-sectional area is substantially equivalent to the fifth cross-sectional area; and
the third cross-sectional area is substantially equivalent to the fourth cross-sectional area.

18. The transformer assembly of claim 10, wherein the second face of the first fin defines a first groove.

19. The transformer assembly of claim 18, wherein the first face of the fourth fin defines a second groove.

20. The transformer assembly of claim 1, wherein:
the first and second fins define a first spacing therebetween;
the second and third fins define a second spacing therebetween, wherein the second spacing is greater than the first spacing; and
the third and fourth fins define a third spacing, wherein the second spacing is greater than the third spacing.

21. The transformer assembly of claim 20, wherein the first spacing is substantially equivalent to the third spacing.

22. An electrical device, comprising:
a printed circuit board; and
a transformer assembly connected to the printed circuit board, wherein the transformer assembly comprises:
a coil;
a magnetic core; and
a heat spreader in contact with the coil and the magnetic core, wherein the heat spreader comprises:
a body member;
a first fin connected to the body member and in contact with the magnetic core;
a second fin connected to the body member and in contact with the magnetic core and the coil;
a third fin connected to the body member and in contact with the magnetic core and the coil; and
a fourth fin connected to the body member and in contact with the magnetic core.

23. The electrical device of claim 22, wherein the electrical device is a power supply.

24. The electrical device of claim 22, wherein the transformer assembly is soldered to the printed circuit board.

25. The electrical device of claim 22, wherein:
the second fin of the heat spreader is adjacent the first fin;
the third fin of the heat spreader is adjacent the second fin; and
the fourth fin of the heat spreader is adjacent the third fin.

* * * * *

UNITED STATES PATENT AND TRADEMARK OFFICE

CERTIFICATE OF CORRECTION

PATENT NO. : 7,130,197 B2
APPLICATION NO. : 10/936843
DATED : October 31, 2006
INVENTOR(S) : Kwong Kei Chin It is certified that error appears in the above-identified patent and that said Letters Patent is hereby corrected as shown below:

Column 3, line 62, delete "fin." and replace therewith --fin--.

Column 4, line 7, delete "unshaped." and replace therewith --u-shaped--.

Signed and Sealed this

Eighteenth Day of November, 2008

JON W. DUDAS
*Director of the United States Patent and Trademark Office*